(12) United States Patent
Sone

(10) Patent No.: US 8,809,826 B2
(45) Date of Patent: Aug. 19, 2014

(54) MEMORY ELEMENT AND MEMORY DEVICE

(75) Inventor: Takeyuki Sone, Miyagi (JP)

(73) Assignee: Sony Corporation, Tokyo (JP)

( * ) Notice: Subject to any disclaimer, the term of this patent is extended or adjusted under 35 U.S.C. 154(b) by 238 days.

(21) Appl. No.: 13/309,151

(22) Filed: Dec. 1, 2011

(65) Prior Publication Data

US 2012/0147656 A1    Jun. 14, 2012

(30) Foreign Application Priority Data

Dec. 9, 2010    (JP) ................................. 2010-274816

(51) Int. Cl.
*H01L 29/02*    (2006.01)

(52) U.S. Cl.
USPC .................................................. 257/2; 257/5

(58) Field of Classification Search
CPC ....... H01L 45/14; H01L 45/141; H01L 45/08; H01L 45/085
USPC ................... 257/3, 4, 5, E47.001, 2
See application file for complete search history.

(56) References Cited

U.S. PATENT DOCUMENTS

| 7,345,908 B2* | 3/2008 | Hachino et al. | 365/148 |
| 2006/0126423 A1* | 6/2006 | Aratani et al. | 365/232 |
| 2010/0059730 A1* | 3/2010 | Ito et al. | 257/2 |

FOREIGN PATENT DOCUMENTS

| JP | 2002-536840 | 10/2002 |
| JP | 2005-197634 | 7/2005 |
| WO | 00/48196 | 8/2000 |

OTHER PUBLICATIONS

Nekkei Electronics;PMC Suitable for Multilayering of Cells; vol. 2003, 1.20; pp. 104.

* cited by examiner

*Primary Examiner* — Yu-Hsi D Sun
(74) *Attorney, Agent, or Firm* — Dentons US LLP

(57) ABSTRACT

A memory element and a memory device having the stable switching characteristics with the characteristics of data retention remaining favorable are provided. The memory element includes a first electrode, a memory layer, and a second electrode in this order. The memory layer includes an ion source layer provided on the second electrode side, a resistance change layer provided between the ion source layer and the first electrode, and a barrier layer provided between the resistance change layer and the first electrode, and having conductivity higher than that of the resistance change layer.

9 Claims, 5 Drawing Sheets

MEMORY ELEMENT AND MEMORY DEVICE

BACKGROUND

The present disclosure relates to a memory element and a memory device storing information based on any change of electrical characteristics observed in a memory layer including an ion source layer and a resistance change layer.

In information devices such as computers, a RAM (Random Access Memory) widely in use is a DRAM (Dynamic Random Access Memory), which operates at a high speed and is high in density. The DRAM is, however, high in cost due to the complicated manufacturing process thereof compared with that of a logic circuit LSI (Large Scale Integration) or of a signal processing circuit generally used for electronic devices. The DRAM is also expected for a frequent refresh operation, i.e., an operation for reading any written information, and amplifying again the information for rewriting thereof. Moreover, as is a volatile memory from which any stored information is lost when a power supply is stopped, the DRAM has a disadvantage of not appropriate for use if long-time storage is expected.

On the other hand, a nonvolatile memory also in use is available for storage of any information even with no power supply. Such a nonvolatile memory is exemplified by FeRAM (Ferroelectric Random Access Memory) or a MRAM (Magnetic Random Access Memory). Such nonvolatile memory, however, has been pointed out that there are limitations on microfabrication considering the need for a high level of voltage for writing and erasing, and the limited number of electrons for injection to a floating gate.

For overcoming such limitations on microfabrication, a next-generation nonvolatile memory currently proposed is a memory element including an ion conductive layer interposed between two electrodes (for example, see Japanese Unexamined Patent Application Publication (Translation of PCT Application) No. 2002-536840, and Nikkei Electronics on Jan. 20, 2003 issue, pp. 104). The ion conductive layer includes metallic element, e.g., copper (Cu), silver (Ag), or zinc (Zn), and a chalcogenide element, e.g., sulfur (S), selenium (Se), or tellurium (Te). In such a memory element, one of the two electrodes includes the metal same as that in the ion conductive layer. Through application of a voltage in between the two electrodes, the metal in the electrode diffuses as ions into the ion conductive layer so that the ion conductive layer shows a change of resistance value or a change of electrical properties such as capacitance.

To be specific, in response to application of a bias voltage of a threshold value or higher to the two electrodes, the metal in the ion conductive layer is ionized, and then is moved in the direction of the negative electrode so that the metal is electrodeposited on the negative electrode. The metal electrodeposited as such grows like branches (dendrites), for example, and reaches the positive electrode. This accordingly forms a current path, and reduces the resistance value of the ion conductive layer. As such, recording of information is performed to the memory element. On the other hand, by application of a voltage opposite in polarity to the bias voltage applied to the two electrodes as above, the metal ions forming the branched current path are dissolved into the ion conductive layer. As a result, the current path disappears, and the resistance value of the ion conductive layer is restored, i.e., increased. In other words, an erasing operation of the recorded information is performed to the memory element.

SUMMARY

With the memory element configured as above, however, a temperature increase or others cause crystallization of the chalcogenide element, thereby causing a change of the material properties. To be specific, any portion originally in the state of high resistance for keeping the recorded information is reduced in resistance when it is in the high-temperature environment or is left as it is for a long time. In other words, the memory element above has a disadvantage of impaired characteristics of data retention.

In consideration thereof, proposed is a memory element as below with the better characteristics of data retention. As an example, a memory element described in Japanese Unexamined Patent Application Publication No. 2005-197634 includes a rare earth oxide film interposed between one of two electrodes and an ion conductive layer. This rare earth oxide film serves as a barrier layer for restricting the ion migration. With the rare earth oxide film as such, by application of a recording voltage of a threshold value or higher, from the electrode containing the metallic element such as Cu, Ag, Zn, or others, ions of the metallic element are diffused to the rare earth oxide film. The ions are then deposited by bonding with electrons on the other electrode side, or remain diffused in the rare earth oxide film. In other words, a current path (filament) containing a large amount of the metallic element of Cu, Ag, or Zn, i.e., filament type is formed in the rare earth oxide film. If not, the rare earth oxide film greatly suffers from defects due to the metallic element of Cu, Ag, or Zn, i.e., non-filament type. This accordingly decreases the resistance value of the rare earth oxide film. Moreover, application of an opposite-polarity voltage ionizes again the current path formed inside of the rare earth oxide film or the metallic element of Cu, Ag, or Zn at the impurity level, and the resulting ions return to the negative electrode side after migrating inside of the rare earth oxide film. This accordingly increases the resistance value of the rare earth oxide film. With the memory element in which the rare earth oxide film changes in resistance as such, the characteristics of data retention thereof remain excellent even if it is microfabricated, is in the high-temperature environment, or is left as it is for a long time.

In the memory element as such, however, when the barrier layer in use is made of a rare earth oxide or a solid electrolyte as described above, for example, the characteristics of data retention are indeed improved but the repeat characteristics of resistance change (switching characteristics) is disadvantageously reduced.

It is thus desirable to provide a memory element and a memory device having the stable switching characteristics with the characteristics of data retention remaining favorable.

A memory element according to an embodiment of the present disclosure includes a first electrode, a memory layer, and a second electrode in this order. The memory layer includes an ion source layer, a resistance change layer, and a barrier layer. The ion source layer is provided on the second electrode side, and the resistance change layer is disposed between the ion source layer and the first electrode. The barrier layer is disposed between the resistance change layer and the first electrode, and has conductivity higher than that of the resistance change layer.

A memory device according to an embodiment of the present disclosure includes a plurality of memory elements each including a first electrode, a memory layer, and a second electrode in this order, and a pulse application section applying a voltage or current pulse selectively to the memory elements. In the memory device, the memory elements are those according to the embodiment of the present disclosure.

With the memory element or the memory device according to the embodiment of the present disclosure, by the barrier layer provided between the resistance change layer and the first electrode, the migration efficiency of metallic ions is improved. This accordingly reduces the remaining amount of the metallic ions forming a current path or at the impurity level while erasing data.

With the memory element or the memory device according to the embodiment of the present disclosure, the barrier layer is disposed between the resistance change layer and the first electrode with conductivity higher than that of the resistance change layer. This configuration favorably improves the efficiency of metallic ions forming a current path or at the impurity level to migrate toward the ion source layer side while erasing data. Accordingly, this reduces the amount of the metallic ions left remained in the vicinity of the first electrode, thereby successfully improving the switching characteristics over a repeated resistance change with the characteristics of data retention remaining satisfactory.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENT

In the below, an embodiment of the present disclosure is described in the following order by referring to the accompanying drawings.

Embodiment

1. Memory Element
2. Memory Device

Example

Embodiment

Memory Element

Figure 1:
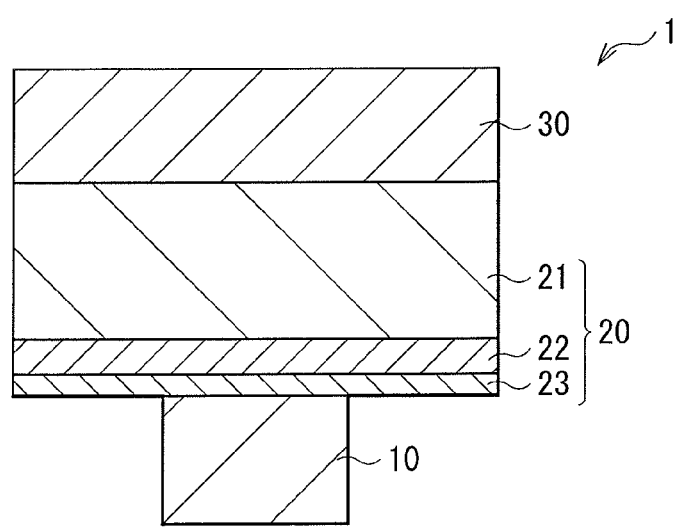
FIG. 1 is a cross-sectional view of a memory element in an embodiment of the present disclosure, showing the configuration thereof.

FIG. 1 is a cross-sectional view of a memory element 1 in an embodiment of the present disclosure, showing the configuration thereof. This memory element 1 includes a lower electrode 10 (first electrode), a memory layer 20, and an upper electrode 30 (second electrode) in this order.

The lower electrode 10 is provided on a silicon substrate 41 formed with a CMOS (Complementary Metal Oxide Semiconductor) circuit as will be described later (FIG. 2), for example, thereby serving as a connection section with the portion of the CMOS circuit. This lower electrode 10 is made of a material for wiring use in the semiconductor process, e.g., tungsten (W), tungsten nitride (WN), copper (Cu), aluminum (Al), molybdenum (Mo), tantalum (Ta), and silicide. When the lower electrode 10 is made of a material such as Cu that possibly causes ion conduction in an electric field, the surface of the lower electrode 10 made of Cu or others as such may be covered with a material that hardly causes ion conduction or thermal diffusion, e.g., W, WN, titanium nitride (TiN), and tantalum nitride (TaN). When an ion source layer 21 that will be described later contains Al, preferably used is a metal film containing one or more of chromium (Cr), W, cobalt (Co), silicon (Si), gold (Au), palladium (Pd), Mo, iridium (Ir), titanium (Ti), and others that are more resistant to ionization than Al, or an oxide or nitride film thereof.

The memory layer 20 is configured by the ion source layer 21, a resistance change layer 22, and a barrier layer 23. The ion source layer 21 contains an element to be converted into movable ions (cations and anions) that diffuse to the resistance change layer 22. The element that is possibly cationized includes one or two or more of metallic elements such as Cu, Ag, germanium (Ge), Zn, and others. An ion conductive material that is to be anionized includes one or more of chalcogen elements including oxygen (O) or Te, S and Se, for example. The ion source layer 21 is disposed on the upper electrode 30 side, and in this example, is in contact with the upper electrode 30. The metallic element(s) and the chalcogen element(s) are bonded together, thereby forming a metal chalcogenide layer. This metal chalcogenide layer is mainly in the amorphous structure, and serves as an ion supply source. In the memory element 1 in this embodiment, the ion source layer 21 has a resistance value higher than that of the resistance change layer 22 in the initial state or in the erasing state.

As for the metallic element that is possibly cationized, as is reduced on the cathode electrode during the operation of writing and forms a current path (filament) in the form of metal, any element chemically stable is preferable, i.e., possibly remains in the form of metal in the ion source layer 21 containing the chalcogen element(s) described above. Such a metallic element includes, in addition to those described above, transition metals of groups 4A, 5A, and 6A in the periodic table, i.e., Ti, zirconium (Zr), hafnium (Hf), vanadium (V), niobium (Nb), Ta, Cr, Mo, and W, for example. Among these elements, one or two or more are possibly used. Alternatively, Ag and Si or others may be used as additive elements to the ion source layer 21.

Moreover, using any metallic element (M) that is more likely to react with Te in the resistance change layer 22 that will be described later, the ion source layer 21 may be in the layered structure of Te/Ion Source Layer (containing the metallic element M). If this is the configuration, with a heat treatment after the film formation, the resulting structure is stabilized as MTe/Ion Source Layer 21. The material more likely to react with Te is exemplified by Al, magnesium (Mg), and others.

The specific material of the ion source layer 21 as such contains ZrTeAl, TiTeAl, CrTeAl, WTeAl, TaTeAl, and others. Such specific materials may also include CuZrTeAl being a result of addition of Cu to ZrTeAl, CuZrTeAlGe being a result of addition of Ge to CuZrTeAl, and CuZrTeAlSiGe being a result of addition of another additive element to CuZrTeAlGe. Another option is ZrTeMg including Mg as an alternative to Al. As for the ionizing metallic element, any similar additive element is possibly used even if a transition metallic element selected for use is not Zr but Ti or Ta, e.g., possibly TaTeAlGe. Moreover, as for the ion conductive material, Te is surely not restrictive, and sulfur (S), selenium (Se), or iodine (I) may be also used, i.e., specifically ZrSAl, ZrSeAl, ZrIAl, CuGeTeAl, and others. Note that Al is not necessarily contained, and CuGeTeZr or others may be also used.

Note that the ion source layer 21 may be added with any other elements for the purpose of preventing peeling of film during a high-temperature heat treatment for the memory layer 20, for example. Silicon (Si) is an exemplary additive element that possibly offers also the improvement of retention characteristics, and is preferably added to the ion source layer 21 together with Zr. Herein, if the content of Si for addition is not enough, the effect of preventing the film peeling is not sufficiently produced, and if the content thereof is too much, the resulting memory operation characteristics are not satisfactory enough. In consideration thereof, the content of Si in the ion source layer 21 is preferably in the range of about 10 to 45 atomic %.

The resistance change layer 22 is disposed on the lower electrode 10 side, and in this example, is in contact with the lower electrode 10. This resistance change layer 22 serves as a barrier against electric conduction. The resistance change layer 22 is low in resistance value compared with the ion source layer 21, and the resistance value thereof shows a change when a predetermined level of voltage is applied between the lower and upper electrodes 10 and 30. In this embodiment, this resistance change layer 22 is made of a compound mainly containing Te that behaves as an anionic component. Such a compound is exemplified by AlTe, MgTe, or ZnTe. As for the composition of the compound containing Te as such, e.g., AlTe, the content of Al is preferably 20 atomic % or higher but 60 atomic % or lower due to reasons that will be described later. Moreover, the resistance change layer 22 preferably has the initial resistance value of 1 M$\Omega$ or larger. Considering as such, the resistance value in the state of low resistance is preferably several hundred k$\Omega$ or smaller. For reading at a high speed the state of resistance of any microfabricated resistance change memory, the resistance value in the state of low resistance is preferably as low as possible. However, since the resistance value is 40 to 100 k$\Omega$ when writing is performed with the requirements of 20 to 50 $\mu$A and 2 V, the memory is supposed to have the initial resistance value higher than that value. Allowing for the one-digit width of resistance separation, the resistance value described above is considered appropriate. Note here that the resistance change layer 22 may be made not only of the above-described material containing Te but also of any previously-used oxide such as GaOx and AlOx. Moreover, the resistance change layer 22 is exemplified as being a single layer, but alternatively, may be structured by two or more layers.

The barrier layer 23 is disposed between the resistance change layer 22 and the lower electrode 10. This barrier layer 23 serves to make uniform the distribution of an electric field applied on the resistance change layer 22. This barrier layer 23 has the conductivity higher than that of the resistance change layer 22. Specifically, the barrier layer 23 preferably has the conductivity 10 times or more but 200 times or less that of the resistance change layer 22, and more preferably, has the conductivity 20 times or more but 100 times or less that of the resistance change layer 22. The material for such a barrier layer 23 includes an oxide or nitride of Ti, Hf, V, Nb, Ta, Cr, Mo, or Zr. The barrier layer 23 has the film thickness of 0.1 nm or more but is 2.0 nm or less, for example. The conductivity of the barrier layer 23 is adjustable by changing the conditions for oxidation or nitridation. To be specific, for formation of the barrier layer 23, the lower electrode 10 made of TiN is formed with a film made of Ti, TiN, Zr, or ZrN on the upper surface thereof, for example, and then the resulting structure is oxidized by oxygen plasma. The resulting barrier layer 23 is made of TiOx, TiON, ZrOx, or ZrON.

The upper electrode 30 may be made of a material similar to that of the lower electrode 10, i.e., a well-known material for use of semiconductor wiring, and preferably, be made of a stable material not reacting with the ion source layer 21 even after post-annealing.

With such a memory element 1 of the embodiment, when a voltage or current pulse is applied by a power supply circuit (pulse application section; not shown) via the lower and upper electrodes 10 and 30, the memory layer 20 shows a change of the electrical characteristics thereof, e.g., change of the resistance value thereof, thereby performing information writing, erasing, and reading. In the below, such an operation is described specifically.

First of all, a positive voltage is applied to the memory element 1 such that the upper electrode 30 is at a positive potential, and the lower electrode 10 side is at a negative potential, for example. In response thereto, any metallic element in the ion source layer 21 is ionized and diffused to the resistance change layer 22, and then is deposited by bonding with electrons on the lower electrode 10 side. As a result, a low-resistance section, i.e., a current path (filament) in this example, is formed on the interface between the lower electrode 10 and the memory layer 20. This current path is made of a low-resistance metallic element reduced in the form of metal. Alternatively, the ionized metallic element remains in the resistance change layer 22, and forms an impurity level. As a result, a current path is formed in the resistance change layer 22, and this accordingly decreases the resistance value of the memory layer 20, i.e., the memory layer 20 shows a decrease of resistance value to be lower (to be in the low-resistance state) than that in the initial state (in the high-resistance state).

Thereafter, even if the memory element 1 becomes free of voltage by stopping the application of the positive voltage thereto, the state of low resistance is retained. This means information writing is done. For use in a once-writable memory device, i.e., a so-called PROM (Programmable Read Only Memory), the memory element 1 is completed with recording only by the process of recording described above. On the other hand, for application use in an erasable memory device, i.e., RAM, EEPROM (Electronically Erasable and Programmable Read Only Memory), or others, a process of erasing is necessary. During the process of erasing, a negative voltage is applied to the memory element 1 such that the upper electrode 30 is at a negative potential, and the lower electrode 10 side is at a positive potential, for example. In response thereto, in the current path formed inside of the memory layer 20, the metallic element is ionized, and then is dissolved into the ion source layer 21 or is bonded with Te or others, thereby forming a compound such as $Cu_2Te$ or CuTe. As a result, the current path made of the metallic element disappears or is decreased in area, and the resistance value thus shows an increase.

Thereafter, even if the memory element 1 becomes free of voltage by stopping the application of the negative voltage thereto, the resistance value therein remains high. This allows erasing of any information written thereto. By repeating such a procedure, the memory element 1 is to be subjected to repeated writing of information and erasing of the written information.

If the state high in resistance value is correlated with information of "0", and if the state low in resistance value is correlated with information of "1", for example, the information of "0" is to be changed to the information of "1" in the process of information recording by the application of a positive voltage, and the information of "1" is to be changed to the information of "0" in the process of information erasing by the application of a negative voltage. Note that, in this example, although the operation of decreasing the resistance of the memory element is correlated with the writing operation and the operation of increasing the resistance thereof is correlated with the erasing operation, the correlation may be inversed.

For demodulation of any recorded data, the larger ratio is more preferable between an initial resistance value and an after-recording resistance value. However, a too large resistance value of the resistance change layer 22 causes a difficulty in writing, i.e., in decreasing the resistance. As a result, since a threshold voltage for writing is increased too much, the initial resistance value is adjusted to be 1 GΩ or smaller. The resistance value of the resistance change layer 22 is possibly controlled by the thickness thereof or the content of anions therein, for example.

In this embodiment, the resistance change layer 22 is made of a compound mainly containing Te. Therefore, during the decrease of resistance of Te, the metallic element diffused from the ion source layer 21 is stabilized in the resistance change layer 22 so that the resulting low-resistance state becomes easy to retain. Moreover, compared with oxides high in electronegativity and silicon compounds being covalent compounds, the binding force of Te with the metallic element is weaker, and thus the metallic element diffused inside of the resistance change layer 22 is easily moved to the ion source layer 21 by the application of an erasing voltage so that the erasing characteristics are improved. Note that, as for the electronegativity of the chalcogenide compounds, since the absolute values thereof are in the ascending order of tellurium<selenium<sulfur<oxygen, the effect of improvement is to be high with the lower content of oxygen in the resistance change layer 22, and with the use of any chalcogenide compound low in electronegativity.

Moreover, in the embodiment, as described above, the ion source layer 21 preferably contains Zr, Al, Ge, and others. In the below, the reasons thereof are described.

When the ion source layer 21 contains Zr, this Zr acts as an ionizing element together with the metallic element such as copper (Cu) described above so that the resulting current path is a mixture of Zr and the above-described metallic element such as Cu. Herein, Zr seems to be reduced on the cathode electrode during the operation of writing, and seems to form a filament in the form of metal in the low-resistance state after the writing. The metal filament as a result of reduction of Zr is relatively difficult to dissolve in the ion source layer 21 containing the chalcogenide element(s) such as S, Se, and Te. Therefore, once the state is put in writing, i.e., in the low-resistance state, the resulting low-resistance state is retained more easily than in the case with a current path containing only the above-described metallic element such as Cu. For example, Cu is formed as a metal filament by the operation of writing. However, Cu in the form of metal is dissolved easily in the ion source layer 21 containing the chalcogenide element(s), and in the state of no application of a voltage pulse for writing, i.e., in the state of data retention, Cu is ionized again and the state is changed to high resistance. The resulting characteristics of data retention are not thus satisfactory. On the other hand, combining Zr with any appropriate content of Cu facilitates amorphization, and keeps uniform the microstructure of the ion source layer 21, thereby contributing to the improvement of the characteristics of resistance value retention.

Also for retention of the high-resistance state while erasing, when the ion source layer 21 contains Zr, a current path to be formed contains Zr, for example, and when Zr is dissolved in the ion source layer 21 again as ions, due to the lower ion mobility of Zr at least than Cu, the Zr ions are resistant to move even if the temperature is increased, or even if they are left as they are for a long time. As such, Zr in the form of metal is not easily deposited on the cathode electrode, and thus remains high in resistance even if it is kept in the temperature higher than the room temperature or if it is left as it is for a long time.

Moreover, when the ion source layer 21 contains Al, if the upper electrode is biased to a negative potential as a result of the erasing operation, the high-resistance state (erasing state) is stabilized by forming an oxide film stable on the interface between the ion source layer 21 behaving like a solid-electrolyte layer and the anode electrode. This also contributes to the increase of the repetition frequency considering the self-reproduction of the resistance change layer. Herein, Al is surely not the only option, and Ge or others acting similar thereto may be also used.

As such, when the ion source layer 21 contains Zr, Al, Ge, and others, compared with the previous memory element, the resulting memory element has the improved characteristics of wide-range resistance value retention and of high-speed operation of writing and erasing, and the increased repetition frequency. Moreover, if any resistance state intermediate between high and low is created through adjustment of an erasing voltage during a change of resistance from low to high, for example, the resulting intermediate state is to be retained with a good stability. Accordingly, the resulting memory is capable not only of binary storage but also of multilevel storage. Herein, such an intermediate state is possibly created also through adjustment of the amount of atoms for deposition by changing a write current during a change of resistance from high to low.

Such various characteristics important for the operation of memory, i.e., the characteristics of operation of writing and erasing with voltage application, the characteristics of resistance value retention, and the repetition frequency of operation, vary depending on the addition content of Zr, Cu, and Al, and also Ge.

If the content of Zr is too much, for example, the resulting ion source layer 21 is decreased too much in resistance value, thereby failing in voltage application effectively to the ion source layer 21, or resulting in a difficulty in dissolving Zr in the chalcogenide layer. This especially causes a difficulty in erasing, and the threshold voltage for erasing is increased based on the addition content of Zr. If the content of Zr is all too much, this results in a difficulty also in writing, i.e., in decreasing of resistance. On the other hand, if the addition content of Zr is too little, the effect of improving the characteristics of wide-range resistance value retention as described above is impaired. In consideration thereof, the content of Zr in the ion source layer 21 is preferably 7.5 or more, and more preferably, 26 atomic % or less.

Moreover, although adding an appropriate content of Cu to the ion source layer 21 indeed facilitates amorphization, if the content thereof is too much, Cu in the form of metal degrades the characteristics of writing retention or adversely affects the speed of the writing operation as is not stable enough in the ion source layer 21 containing the chalcogen element(s). Whereas, a combination of Zr and Cu produces the effect of making amorphous the ion source layer 21 with ease, and of keeping uniform the microstructure of the ion source layer 21. This accordingly prevents the material components in the ion source layer 21 from becoming not uniform by the repeated operation, thereby increasing the repetition frequency and improving the retention characteristics. When the content of Zr in the ion source layer 21 is enough in the above-described range, the current path of metal zirconium (Zr) is supposed to remain as it is even if the current path made of Cu is dissolved again into the ion source layer 21, and thus the characteristics of writing retention are not affected. Moreover, as for the preferable addition content of Cu, as long as cations and anions possibly being the results of dissociation and ionization are in the equivalent relationship of the amount of charge, the equivalence ratio of the charge of ions is supposed to fall within a range of {(Highest Valence of Zr Ions×Number of Moles or Atomic %)+(Valence of Cu Ions×Number of Moles or Atomic %)}/(Valence of Chalcogen Ions×Number of Moles or Atomic %)=0.5 to 1.5.

Note here that, virtually, the characteristics of the memory element 1 are dependent on the composition ratio between Zr and Te. Accordingly, the composition ratio between Zr and Te preferably falls within the following range.

Composition Ratio of Zr (Atomic %)/Composition Ratio of Te (Atomic %)=0.2 to 0.74

This is not always evident, but since Cu has the degree of dissociation lower than that of Zr, and since the resistance value of the ion source layer 21 is determined by the composition ratio between Zr and Te, as long as the composition ratio between Zr and Te falls within the above-described range, the resistance value remains suitable. This thus seems because the bias voltage applied to the memory element 1 works effectively to the portion of the resistance change layer 22.

When the value does not fall within the range described above, e.g., when the equivalence ratio is too large, the balance between the cations and anions is lost, and thus among the existing metallic elements, any element not ionizing is increased in amount. Therefore, the current path generated by the operation of writing during the operation of erasing may not be eliminated efficiently. Similarly, when the anion element exists too much because the equivalence ratio is too small, the current path in the form of metal generated by the operation of writing is not inclined to remain in the form of metal. The characteristics of writing state retention thus seem to be degraded.

When the content of Al is too much, the Al ions become easy to move, thereby creating the state of writing by reduction of the Al ions. Since Al is not stable enough in the form of metal in the chalcogenide solid electrolyte, the characteristics of low-resistance writing state retention are degraded. On the other hand, when the content of Al is too little, the effect of improving the erasing operation itself or the characteristics of high-resistance region retention is impaired, thereby decreasing the repetition frequency. In consideration thereof, the content of Al in the ion source layer 21 is preferably 30 atomic % or more, and more preferably, 50 atomic % or less.

Herein, Ge is not necessarily contained, but when Ge is to be added, the content thereof is preferably 15 atomic % or less considering that too much content of Ge degrades the characteristics of writing retention.

In the below, the manufacturing method of the memory element 1 in the embodiment is described.

First of all, on a substrate formed with a CMOS circuit such as selection transistor, the lower electrode 10 made of TiN is formed, for example. Thereafter, if necessary, any oxides or others on the surface of the lower electrode 10 are removed by reverse sputtering, for example. Next, the formation of layers is performed up to the upper electrode 30 including the barrier layer 23, the resistance change layer 22, and the ion source layer 21 in succession through exchange of targets in a device for sputtering. The targets herein are those each with the composition adapted for the material of the corresponding layer. The diameter of the electrode is 20 to 300 nmφ. A film of alloy is formed at the same time using a target of a component element.

After the formation of layers up to the upper electrode 30, a wiring layer (not shown) is formed for connection to the upper electrode 30, and a contact section is connected to achieve a common potential among all of the memory elements 1. Thereafter, the layered film is subjected to a post-annealing process. As such, the memory element 1 of FIG. 1 is completed.

In this memory element 1, as described above, a voltage is so applied that the upper electrode 30 is at a positive potential and the lower electrode 10 is at a negative potential, thereby forming a current path on the interface between the lower electrode 10 and the resistance change layer 22. This accordingly decreases the resistance value of the resistance change layer 22 so that writing is performed. Next, to each of the upper and lower electrodes 30 and 10, applied this time is a voltage whose polarity is opposite to that applied thereto for writing. In response thereto, the metallic element in the current path formed inside of the resistance change layer 22 is ionized again, and then is dissolved into the ion source layer 21. This accordingly increases the resistance value of the resistance change layer 22 so that erasing is performed.

In the previous memory element, when an erasing voltage is applied between the upper and lower electrodes, the electric field is mainly directed onto the interface between the resistance change layer and the lower electrode. As a result, a part of the metallic element forming the current path may not be moved to the ion source layer, and may be left remained in the vicinity of the lower electrode. The metallic element remained in the vicinity of the lower electrode as such becomes the cause of degradation of the repeat characteristics of the memory element. On the other hand, in this embodiment, when an erasing voltage is applied between the upper and lower electrodes 30 and 10, the electric field applied on the resistance change layer 22 becomes uniform. This is thanks to the provision of, between the lower electrode 10 and the resistance change layer 22, the barrier layer 23 whose conductivity is higher than that of the resistance change layer 22. This accordingly improves the efficiency of the metallic element forming the current path to move toward the ion source layer 21 while erasing data. In other words, this reduces the amount of the metallic ions left remained in the vicinity of the lower electrode 10, thereby preventing the reduction of the resistance value of the resistance change layer 22.

As described above, the memory element 1 in this embodiment includes, between the lower electrode 10 and the resistance change layer 22, the barrier layer 23 whose conductivity is higher than that of the resistance change layer 22. This accordingly improves the efficiency of the metallic ions forming the current path to move toward the ion source layer side while erasing data. The better efficiency as such leads to the reduction of the amount of the metallic ions left remained in the vicinity of the lower electrode 10 so that the resistance change layer 22 is protected from reduction of resistance, which is caused by accumulation of the metallic ions. In other words, this allows the improvement of the switching characteristics of repeated resistance change at the same time with the satisfactory characteristics of data retention.

Moreover, since the ion source layer 21 contains Zr, Al, Ge, or others, the characteristics of data retention thereof are excellent. Even if a transistor is reduced in current drive power due to the microfabrication of the memory element, retention of information is possible. As such, by configuring a memory device using such a memory element 1, the resulting memory device is high in density and is small in size.

Memory Device

By arranging a plurality of memory elements 1 described above in rows or in a matrix, for example, a memory device (memory) is possibly configured. At this time, as appropriate, the memory elements 1 may be each connected with a MOS (Metal Oxide Semiconductor) transistor for element selection use or with a diode to configure a memory cell. The resulting memory cells may be then each connected to a sense amplifier, an address decoder, circuits of writing, erasing, and reading, and others by wiring.

Figure 2:
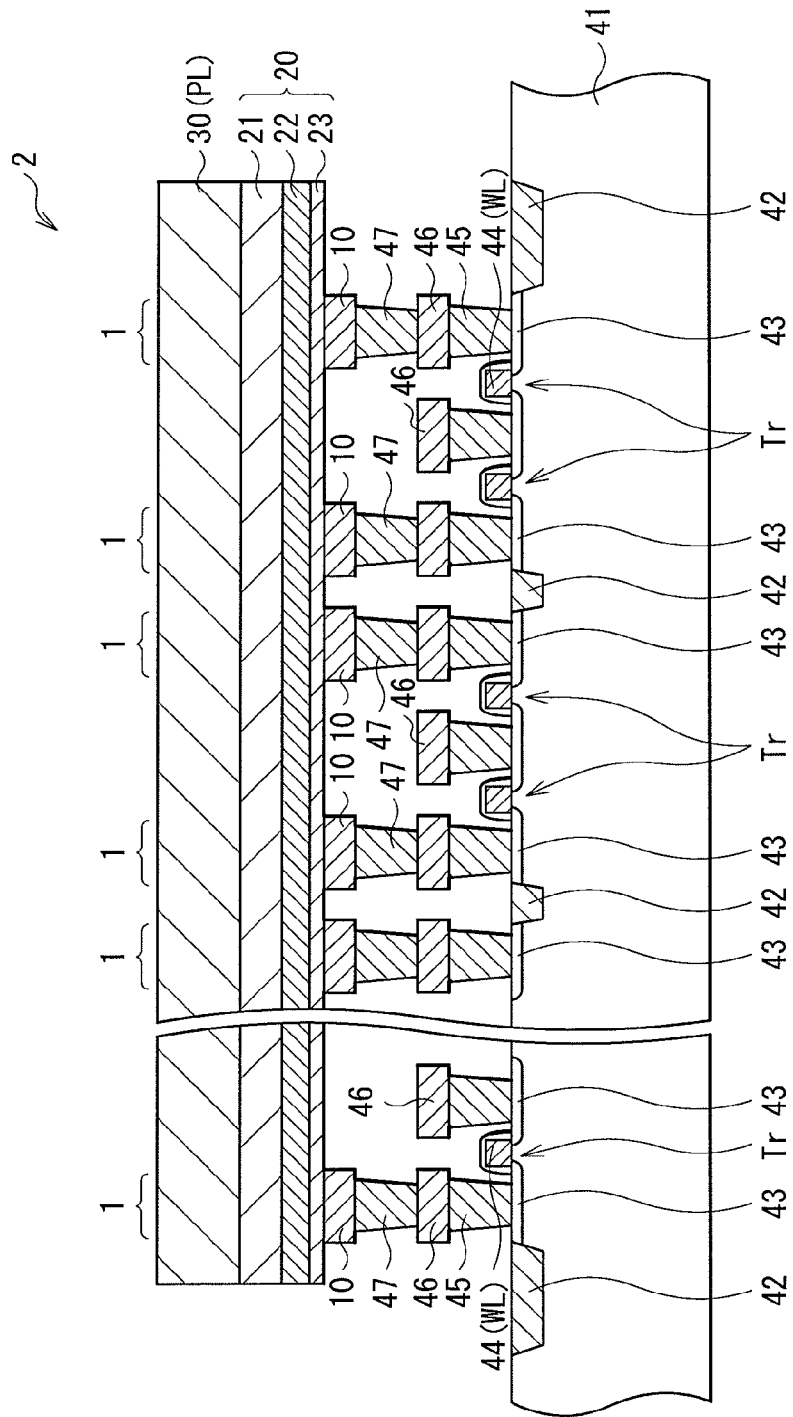
FIG. 2 is a cross-sectional view of a memory cell array using the memory element of FIG. 1, showing the configuration thereof.
Figure 3:
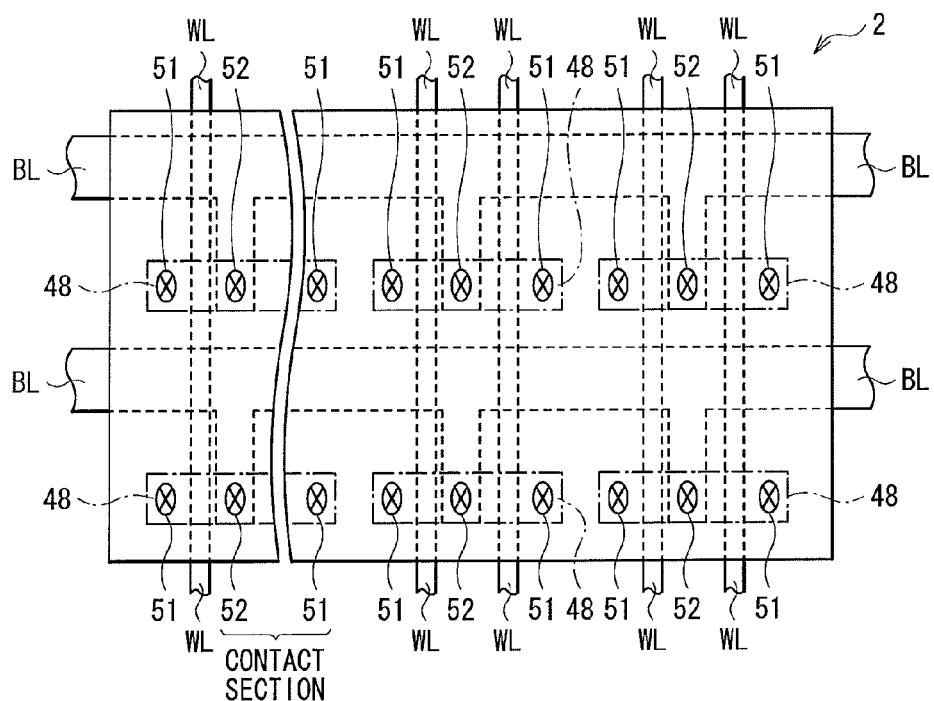
FIG. 3 is a plan view of the memory cell array of FIG. 2.

FIGS. 2 and 3 each show an exemplary memory device (memory cell array) including a plurality of memory elements 1 arranged in a matrix. FIG. 2 shows the cross-sectional configuration of the memory cell array, and FIG. 3 shows the configuration thereof in a planar view. In this memory cell array 2, to each of the memory elements 1, wiring for connection to the lower electrode 10 side thereof is so provided as to intersect wiring for connection to the upper electrode 30 side thereof, and at the respective intersection points of the wiring, the memory element 1 is disposed.

The memory elements 1 all share the layers, i.e., the barrier layer 23, the resistance change layer 22, the ion source layer 21, and the upper electrode 30. That is, these layers, i.e., the barrier layer 23, the resistance change layer 22, the ion source layer 21, and the upper electrode 30, are configured of common layers to all of the memory elements 1 (are each one specific layer for use by all of the memory elements 1). The upper electrode 30 is a plate electrode PL for shared use by any adjacent cells.

On the other hand, the lower electrode 10 is provided individually to each of the memory cells so that any adjacent memory cells are electrically separated from one another. As such, the memory elements 1 in the memory cells are each defined by position corresponding to its lower electrode 10. The lower electrodes 10 are each connected to its corresponding MOS transistor Tr for cell selection use, and the memory elements 1 are each disposed above its corresponding MOS transistor Tr.

The MOS transistor Tr is configured by source/drain regions 43, and a gate electrode 44, which are formed in a region separated by an element separation layer 42 in the substrate 41. The gate electrode 44 is formed, on the wall surface, with a side wall insulation layer (not shown). The gate electrode 44 serves also as a word line WL, which is one of two pieces of address wiring for the memory element 1. One of the source/drain regions 43 of the MOS transistor Tr is electrically connected to the lower electrode 10 of the memory element 1 via various layers, i.e., a plug layer 45, a metal wiring layer 46, and a plug layer 47. The other of the source/drain regions 43 of the MOS transistor Tr is connected to the metal wiring layer 46 via the plug layer 45. The metal wiring layer 46 is connected to a bit line BL (refer to FIG. 3), which is the remaining piece of the address wiring for the memory element 1. Note that, in FIG. 3, an active region 48 of the MOS transistor Tr is indicated by alternate long and short dashed lines. In the active region 48, contact sections 51 are connected to the lower electrode 10 of the memory element 1, and a contact section 52 is connected to the bit line BL.

In such a memory cell array 2, when a voltage is applied to the bit lines BL with the gate of the MOS transistor Tr turned ON by the word line WL, the voltage is applied to the lower electrode 10 of the selected memory cell via the source/drain of the MOS transistor Tr. In this example, as for the voltage applied to the lower electrode 10, when the polarity thereof is at a negative potential compared with the potential of the upper electrode 30 (the plate electrode PL), the resistance value of the memory element 1 is changed in state to low resistance as described above, whereby the selected memory cell is written with information. Next, when the potential of the voltage applied this time to the lower electrode 10 is positive compared with the potential of the upper electrode 30 (the plate electrode PL), the resistance value of the memory element 1 is changed in state again to high resistance, whereby the information written to the selected memory cell is erased. For reading of the written information, for example, a selection of memory cell is made by the MOS transistor Tr, and with respect to the selected memory cell, a predetermined level of voltage or current is applied. The current or voltage varying in level based on the resistance state of the memory element 1 at this time is detected via a sense amplifier or others connected to the tip of the bit line BL or of the plate electrode PL. Herein, the voltage or current for application to the selected memory cell is set to be smaller than the threshold value of the voltage or others at which the memory element 1 shows a change of resistance value.

Figure 4:
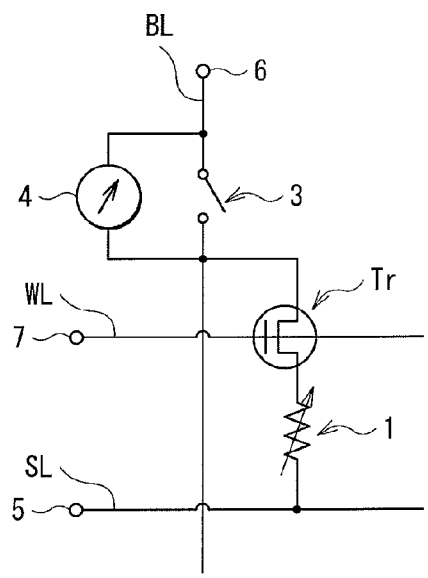
FIG. 4 is a diagram showing the configuration of a drive circuit of a memory element in Example.

FIG. 4 shows the configuration of a drive circuit including the memory element 1. In other words, with respect to the memory element 1, a selection transistor (NMOS (N-channel Metal Oxide Semiconductor) transistor) Tr and a switch 3 are arranged in series. The upper electrode 30 of the memory element 1 is connected to a terminal 5 via a source line SL, and the lower electrode 10 is connected to an end of the selection transistor Tr. The other end of the selection transistor Tr is connected to a terminal 6 via the switch 3 and a bit line BL. The gate section of the selection transistor Tr is connected to a terminal 7 via a word line WL. The terminals 5 to 7 described above are each connected to a pulse voltage source in the outside for reception of a pulse voltage from the outside. Moreover, with respect to the switch 3, an ammeter 4 is arranged in parallel, and when the switch 3 is in the open state, serves to measure the current flowing to the circuit.

Figure 5:
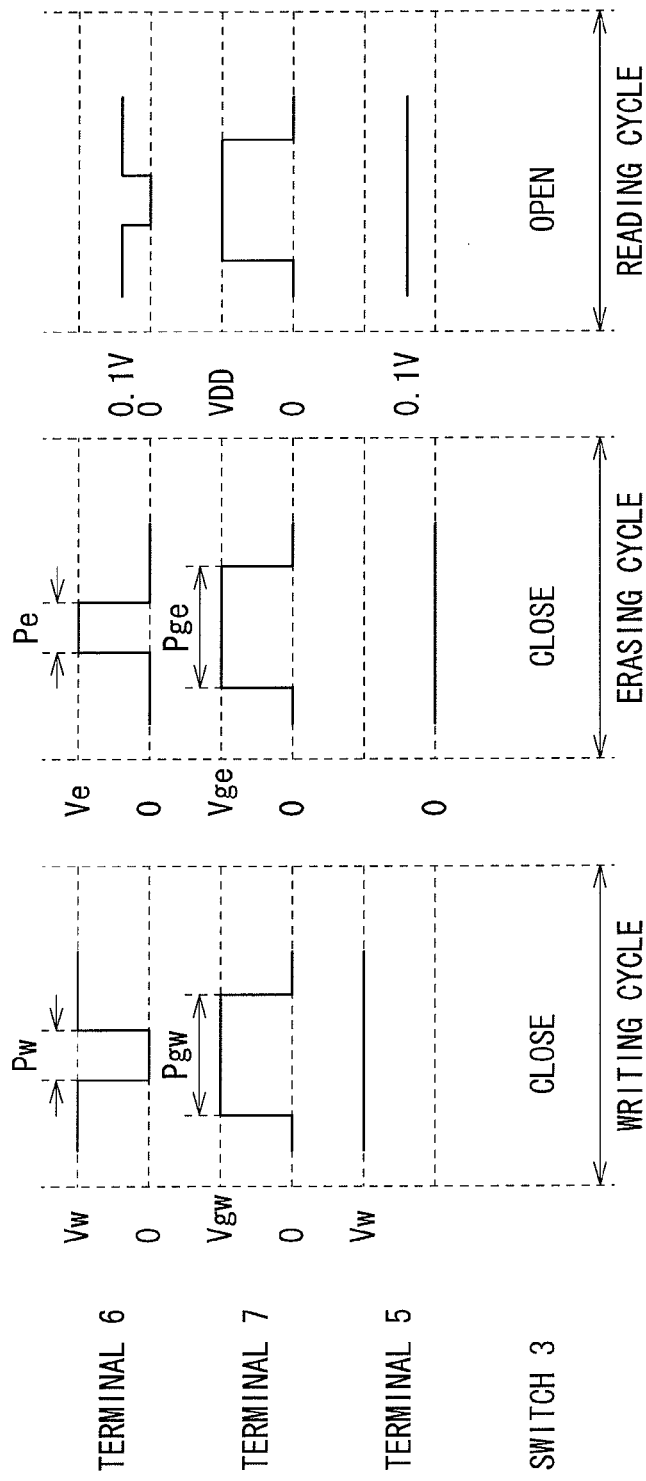
FIGS. 5A to 5C are waveform charts of a voltage for application.

By application of a pulse voltage in the waveforms as shown in FIGS. 5A to 5C, for example, operations of writing, erasing, and reading of information are respectively performed to the memory element 1. First of all, for the operation of writing, a positive voltage is applied to the memory element 1 such that the upper electrode 30 side is at a positive potential, and the lower electrode 10 side is at a negative potential, for example. In response thereto, conduction of conductive ions, e.g., Cu ions, is established in the ion source layer 21 of the memory layer 20, and the ions are then deposited by bonding with electrons on the lower electrode 10 side. As a result, a low-resistance Cu current path reduced in the form of metal is formed in the resistance change layer 22 so that the resistance value is reduced. Thereafter, if the memory element 1 becomes free of voltage by stopping the application of the positive voltage thereto, the state of low resistance value is retained. This means information writing is done (FIG. 5A).

During the process of erasing, a negative voltage is applied to the memory element 1 such that the upper electrode 30 side is at a negative potential, and the lower electrode 10 side is at a positive potential. In response thereto, in the current path formed inside of the high-resistance layer, Cu is oxidized and then is ionized, and then is dissolved into the memory layer 20 or is bonded with Te, thereby forming a compound such as $Cu_2Te$ or CuTe. As a result, the current path made of Cu disappears or is decreased in area, and the resistance value thus shows an increase. Thereafter, if the memory element 1 becomes free of voltage by stopping the application of the negative voltage thereto, the resistance value therein remains high. This allows erasing of any information written thereto (FIG. 5B). By repeating such a procedure, the memory element 1 is to be subjected to repeated writing of information and erasing of the written information. Herein, if the state high in resistance value is correlated with information of "0", and if the state low in resistance value is correlated with information of "1", for example, the information of "0" is to be changed to the information of "1" in the process of information recording by the application of a positive voltage, and the information of "1" is to be changed to the information of "0" in the process of information erasing by the application of a negative voltage.

For reading of the written information, the switch 3 is put in the open state, and a current value flowing through the ammeter 7 is detected by application of voltage pulses lower in level than the threshold value of a voltage for a change of resistance value of the memory element 1 (FIG. 5C).

The memory device of this embodiment is applicable to various types of memory devices as described above. For example, the memory device is applicable for use with any types of memories such as once-writable PROM, electrically erasable EEPROM, or so-called RAM available for high-speed writing, erasing, and reproduction.

Example

In the below, a specific example of the present disclosure is described.

Similarly to the embodiment described above, the memory element 1 of FIG. 1 was manufactured. First of all, the memory layer 20 and the upper electrode 30 were formed on the lower electrode 10 using a device for sputtering. This lower electrode 10 was enclosed by $TEOS-SiO_2$, and in the cylindrical shape with the diameter of 25 nm, for example. The memory layer 20 was in the layered structure of the ion source layer 21, the resistance change layer 22, and the barrier layer 23. The ion source layer 21 was the CuGeTeAlZr layer with the film thickness of 60 nm, and the resistance change layer 22 was a Te layer with the film thickness of 3 nm. The barrier layer 23 was made of Ti or Zr oxide with the thickness of 2 nm, 0.3 nm, or 0.5 nm. Herein, seven types of memory elements (Examples 1 to 7) were manufactured, each in which the resistance change layer 22 was assumed to have the conductivity of 167 S/m, and the barrier layer was assumed to have the varying conductivity up to 200 times as high as the conductivity of the resistance change layer 22 under varying oxidation (or nitridation) conditions. To be specific, in Examples 1 to 7, the Ti or Zr film described above was subjected to plasma oxidation under the atmosphere of oxygen of 10 torr for 60 or 600 seconds so that the barrier layer 23 was adjusted to have the conductivity up to 200 times of the conductivity of the resistance change layer 22, i.e., 1, 2.5, 8, 18, 30, 100, and 200 times. In Examples 1 to 7 as such, the possible number of times for the repeated operation was counted with respect to each value of the conductivity of the barrier layer 23. Note that, for the counting as such, the circuit of FIG. 4 was used, and the gate voltage while writing was 1.6 V, the pulse application voltage was 3 V, the pulse width was 10 ns, the gate voltage while erasing was 3.0 V, the pulse application voltage was 2.0 V, and the pulse width was 10 ns.

For demodulation of any recorded data, when the ratio of an after-writing resistance value to an after-erasing resistance value was twice or more, the demodulation was possibly done. In consideration thereof, in Examples 1 to 7, the number of times was counted until the ratio of the after-writing resistance value to the after-erasing resistance value became twice or less.

Figure 6:
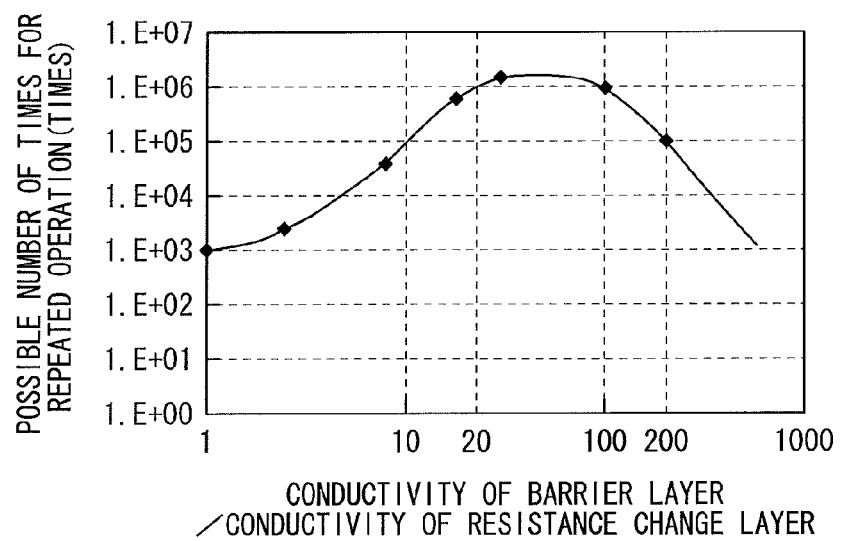
FIG. 6 is a characteristics diagram showing the relationship between a repetition frequency and conductivity in Example.

FIG. 6 shows the relationship between each value of conductivity of the barrier layer 23, and the corresponding possible number of times for the repeated operation in Examples 1 to 7. FIG. 6 shows that, by the barrier layer 23 having the conductivity of 10 times or more but 200 times or less that of the resistance change layer 22, the possible number of times for repeated operation is one hundred thousand times or more. Moreover, by the barrier layer 23 having the conductivity of 20 times or more but 100 times or less that of the resistance change layer 22, the possible number of times for repeated operation is ten hundred thousand times or more, thereby favorably leading to the switching characteristics of resistance change with better stability.

Herein, as for the optimal configuration, the ion source layer 21 may be specifically made of a transition metal such as Zr. This is considered desirable because the chalcogenide film in the ion source layer is stabilized thereby. Herein, although Al functions also as movable ions, since the melting point thereof becomes higher than that of Te with the formation of $Al_4Te_6$, Al may be used also as a structure. Moreover, in the embodiment above and others, Te is used as a chalcogenide material for forming anions, but alternatively, S or Se may be also used. If this is the case, however, a preferable chalcogenide material is the one that is more resistant to move than cations in the ion source layer 21.

Furthermore, as for the controllability over resistance change by voltage application in the resistance change layer 22, as described above, an important factor is control over reaction control and diffusion control. Basically, the rate of reaction shows an increase exponentially in response to application of a high level of voltage, but the rate of diffusion shows an increase not exponentially but more like linearly. As such, for improving the controllability, a voltage for use is preferably as low as possible, and a slow operation is desirable.

While the present disclosure has been described with reference to an embodiment and Example, the foregoing description is in all aspects illustrative and not restrictive. It is understood that numerous other modifications and variations may be devised.

For example, in the embodiment and Example described above, the configuration of the memory element 1, and that of the memory cell array 2 are specifically described. However, all of the layers are not necessarily provided, or any other layers may be also provided.

Furthermore, for example, the materials of the layers, the film-forming methods and conditions, and others described in the embodiment and Example above are surely not restrictive, and any other materials or any other film-forming methods will also do. For example, the ion source layer 21 may be added with any other metallic elements, e.g., Ti, Hf, V, Nb, Ta, Cr, Mo, or W. Moreover, besides Cu, Ag, and zinc (Zn), nickel (Ni) or others may be also added.

In the embodiment and Example described above, although exemplified is the memory element 1 in which movable ions are cations, this is surely not restrictive, and an ReRAM using anions is also applicable.

The present disclosure contains subject matter related to that disclosed in Japanese Priority Patent Application JP 2010-274816 filed in the Japan Patent Office on Dec. 9, 2010, the entire content of which is hereby incorporated by reference.

What is claimed is:

1. A memory element, comprising:
a first electrode, a memory layer, and a second electrode in this order,
wherein,
the memory layer includes
(i) an ion source layer provided on the second electrode side,
(ii) a resistance change layer provided between the ion source layer and the first electrode, resistance of the resistance change layer changing in response to an insertion thereinto or an extraction therefrom of ions from the ion source layer in response to an application of voltage or current signals to the first and second electrodes, and
(iii) a barrier layer, and
the barrier layer is between the resistance change layer of the memory layer and the first electrode and is in contact with the resistance change layer, the barrier layer having a conductivity higher than that of the resistance change layer.

2. The memory element according to claim 1, wherein the conductivity of the barrier layer is 10 times or more but 200 times or less that of the conductivity of the resistance change layer.

3. The memory element according to claim 1, wherein the barrier layer contains an oxide or nitride of titanium (Ti), hafnium (Hf), vanadium (V), niobium (Nb), tantalum (Ta), chromium (Cr), molybdenum (Mo), or zirconium (Zr).

4. The memory element according to claim 1, wherein the ion source layer includes one or more of silicon (Si), zirconium (Zr), and aluminum (Al), and one or more metallic elements of copper (Cu), silver (Ag), germanium (Ge), zinc (Zn), zirconium (Zr), titanium (Ti), hafnium (Hf), vanadium (V), niobium (Nb), tantalum (Ta), chromium (Cr), molybdenum (Mo), and tungsten (W).

5. The memory element according to claim 4, wherein a change of resistance value occurs by formation of a low-resistance section including the metallic element in the resistance change layer in response to the application of the voltage signal to the first and second electrodes.

6. The memory element according to claim 4, wherein the ion source layer further includes one or more of sulfur (S), selenium (Se), and tellurium (Te).

7. The memory element according to claim 1, wherein the ion source layer includes one or more of silicon (Si), zirconium (Zr), and aluminum (Al).

8. The memory element according to claim 7, wherein the ion source layer further includes one or more of sulfur (S), selenium (Se), and tellurium (Te).

9. A memory device, comprising:
a plurality of memory elements each including a first electrode, a memory layer, and a second electrode in this order; and
a pulse application section for applying a voltage or current pulse selectively to the memory elements to write to or read from the memory elements,
wherein,
the memory layer includes
(i) an ion source layer provided on the second electrode side,
(ii) a resistance change layer provided between the ion source layer and the first electrode, resistance of the resistance change layer changing in response to an insertion thereinto or an extraction therefrom of ions from the ion source layer in response to the application of the voltage or current pulse to the first and second electrodes, and
(iii) a barrier layer, and
the barrier layer is between the resistance change layer of the memory layer and the first electrode and is in contact with the resistance change layer, the barrier layer having a conductivity higher than that of the resistance change layer.

* * * * *